United States Patent [19]
Arledge et al.

[11] Patent Number: 5,382,471
[45] Date of Patent: Jan. 17, 1995

[54] ADHERENT METAL COATING FOR ALUMINUM NITRIDE SURFACES

[75] Inventors: John K. Arledge, Lauderhill; Thomas J. Swirbel, Davie; James L. Davis, Coral Springs, all of Fla.

[73] Assignee: Motorola, Inc., Schaumburg, Ill.

[21] Appl. No.: 12,824

[22] Filed: Feb. 3, 1993

Related U.S. Application Data

[62] Division of Ser. No. 770,270, Oct. 3, 1991, Pat. No. 5,217,589.

[51] Int. Cl.6 ............................................. B32B 15/04
[52] U.S. Cl. .................................. 428/336; 428/469; 428/472; 428/697; 428/698; 428/699; 428/701; 428/702
[58] Field of Search ............... 428/698, 697, 699, 472, 428/469, 336, 701, 702

[56] References Cited

U.S. PATENT DOCUMENTS

| | | | |
|---|---|---|---|
| 4,659,611 | 4/1987 | Iwase et al. | 428/699 |
| 4,756,976 | 7/1988 | Komeya et al. | 428/698 |
| 4,761,345 | 8/1988 | Sato et al. | 428/555 |
| 4,840,853 | 6/1989 | Iio et al. | 428/698 |
| 4,863,658 | 9/1989 | Sugiura et al. | 264/65 |

FOREIGN PATENT DOCUMENTS

| | | | |
|---|---|---|---|
| 0189680 | 10/1984 | Japan | 136/244 |
| 2117971 | 10/1983 | United Kingdom | 136/244 |

Primary Examiner—Archene Turner
Attorney, Agent, or Firm—Dale W. Dorinski

[57] ABSTRACT

A metallized aluminum nitride substrate (40) has a first layer (42) of deposited metal, comprising chromium, chromium oxide, and an aluminum nitride/chromium oxide complex represented by the formula $$Al_a N_b O_c Cr_d$$

where a, b, c and d are numbers representing relative combining ratios. The first layer is formed by sputtering about 10–500 Ångstroms of chromium onto the substrate under vacuum, and then heating the substrate in an oxygen-containing atmosphere at conditions of time and temperature sufficient to convert at least portions of the deposited chromium to chromium oxide, in order to form an adherent metal system. A second layer (44) of metal such as chromium covers the first layer. A third layer (46) of metal is deposited on the second layer in a manner sufficient to prevent oxidation of the second layer.

3 Claims, 4 Drawing Sheets

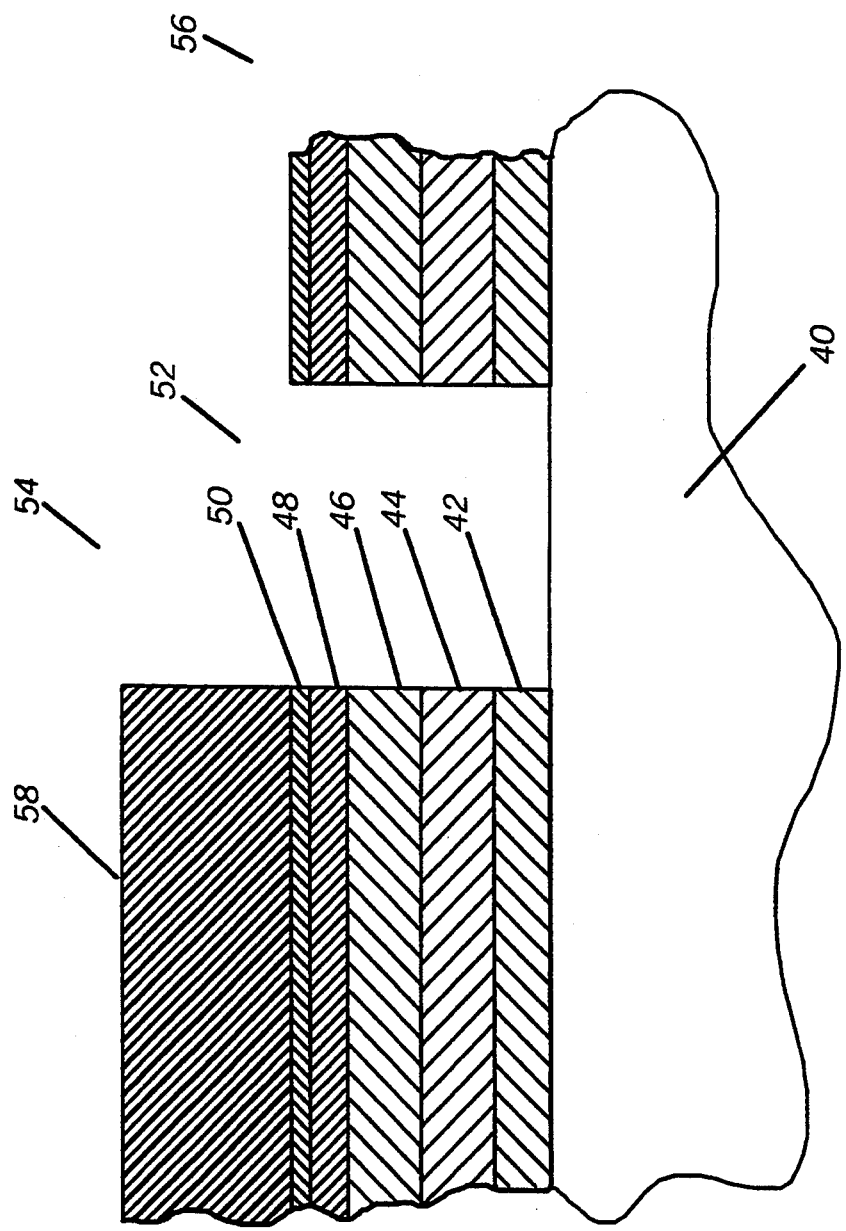

ADHERENT METAL COATING FOR ALUMINUM NITRIDE SURFACES

CROSS REFERENCE TO RELATED APPLICATIONS

This application is a divisional of U.S. patent application Ser. No. 770,270 filed Oct. 3, 1991, by Arledge et al., entitled "Adherent Metal Coating for Aluminum Nitride Surfaces" and assigned to Motorola, Inc. now U.S. Pat. No. 5,217,589.

TECHNICAL FIELD

This invention relates generally to thin film coatings for ceramic substrates and more particularly to an adherent thin film metal coating for aluminum nitride substrates.

BACKGROUND OF THE INVENTION

The production of hybrid circuits on substrates, such as aluminum oxide and aluminum nitride, is conventionally performed using sputtering techniques. Thin films of materials can be uniformly deposited on substrates by evaporation or sputter deposition. Sputter deposition is a far more complex process than evaporation, requiring more care and skill for good process control. The adhesion of the thin film to the substrate is significantly better with sputtering than with vacuum evaporation. This is due both to enhanced substrate cleanliness and to the very energetic sputtered atoms. In sputtering, the material to be coated as a thin film is dislodged from the source or target by the impact of controlled, low pressure inert gas ions accelerated by a potential of five hundred to five thousand volts. The dislodged atoms deposit on a substrate which is located at the anode or in a separate holder. This mechanism of vapor generation in sputtering through high energy impact results in its unique ability to deposit films of materials having very low vapor pressure (high melting point). Since sputtering rates are, in general, similar for different metals and alloys, sputtering provides better compositional control of complex coating materials than vacuum evaporation. The substrate is typically cleaned by exposing it to a plasma-glow discharge sufficient to remove organic contaminants from the surface. The substrate is then coated with metal by sputtering or evaporating a thin layer of chromium or titanium as a bonding layer, and further vacuum metallizing a layer of copper over the bonding layer before any significant oxidation of the chromium or titanium can occur. In some instances, a layer of nickel is vacuum deposited between the chromium and the copper layers. In this case, both the nickel and the copper layer are deposited before any significant oxidation of the chromium or titanium layer can occur. The steps of this process are preferably performed one after the other in the same evacuated reactor without breaking the vacuum or admitting any oxygen into the reaction chamber. When this operation is complete, the substrate is removed from the chamber and is ready for subsequent electroplating, circuit definition, and other treatments, as may be desired to develop the appropriate circuitry. A typical procedure for treating substrates is outlined in U.S. Pat. No. 4,604,168 issued to Liu and Lindsay on Aug. 5, 1986, and addresses the need to exclude oxygen from the chamber during sputtering.

Unfortunately, this process of sputtering an adherent layer of chromium to the substrate requires that the chromium interact with the surface of the substrate in order to form a bond to the substrate. When vacuum metallizing substrates such as aluminum nitride, adhesive failure is frequently seen, due to a separation between the chromium and the aluminum nitride surface. This is thought to be due to a lack of interaction with the aluminum nitride. Therefore, we find that aluminum nitride does not provide proper adhesion in the conventional thin film sputtering processes.

Aluminum nitride substrates show poor adhesion of the metal as exhibited by peeling of the metal away from the substrate and blistering of the metal. It would be highly advantageous to have a method of metallizing thin films to aluminum nitride that would provide improved adhesion and eliminate blistering for the formation of hybrid electronic circuits.

SUMMARY OF THE INVENTION

Briefly, according to the invention, there is provided a metallized aluminum nitride substrate. The aluminum nitride has a first layer of deposited metal, comprising chromium, chromium oxide, and a complex represented by the formula $$Al_a N_b O_c Cr_d$$

where a, b, c and d are numbers representing relative combining ratios. A second layer of metal covers the first layer.

In alternate embodiments of the invention, the first layer is between about 10 Ångstroms and about 500 Ångstroms thick, and the second layer of metal is chromium.

Still another embodiment of the invention provides for a first deposited layer comprising chromium, chromium oxide, and an aluminum nitride/chromium oxide complex. The first layer is formed by depositing chromium about 10–500 Ångstroms thick onto the substrate and heating the substrate in an oxygen-containing atmosphere at conditions of time and temperature sufficient to convert at least portions of the deposited chromium to chromium oxide. A second layer of chromium is deposited on the first layer, and a third layer of metal is deposited on the second layer of chromium in a manner sufficient to prevent oxidation of the second layer of chromium.

BRIEF DESCRIPTION OF THE DRAWINGS

FIG. 4 is a cross-sectional view of an electronic circuit made in accordance with the invention (not to scale).

DETAILED DESCRIPTION OF THE PREFERRED EMBODIMENT

Ceramic substrates, such as aluminum oxide and aluminum nitride, are typically metallized by sputtering a thin film of an adherent metal (typically known as a "glue" metal) such as aluminum, chromium, cobalt, copper, iron, nickel, palladium, platinum, rhenium, rhodium, silicon, tantalum, titanium, tungsten, vanadium, or alloys of these metals, onto the surface of the substrate. These metals are highly reactive and serve to provide an adherent layer between the substrate and subsequent metal layers. It is, therefore, important to deposit them in an inert environment in order to prevent conversion of the metal to a metal oxide. The sputtering process is typically performed under a partial or full vacuum in the absence of oxygen in order to prevent oxidation of the metal layer prior to deposition of subsequent layers. The sputtering literature is replete with articles exhorting the importance of preventing oxidation of the glue metal layer (for example, U.S. Pat. No. 4,604,168).

Adhesion of thin film metals to substrates is also dependent upon the energy of the impinging atoms or ions and the cleanliness of the substrate. The maximum energy of the atoms in an electron beam evaporation process is approximately 5 eV. By contrast, neutral atoms from low pressure sputtering may peak at 30 eV energy. Thus, we may reasonably conclude that the more energetic atoms produced by the sputtering process will disturb the substrate matrix to greater depth and give increased adhesion at the surface. In addition, adhesion in sputtering processes is improved because it is very easy to clean the substrate while it is in the deposition chamber. This cleaning is accomplished by reversing the polarity of the sputtering chamber for a short period of time. This will sputter the substrate and remove contaminants that have been absorbed on the surface. Contaminant materials are blasted from the surface by the incoming ions and immediately replaced by the process gas atoms. Once in the gas phase, the contaminants are swept to the vacuum pumps in the stream of process gas. Any reabsorption of contaminants on the substrate surface will be relatively slow, making it possible to coat the substrate while it is still contaminant free.

Figure 1:
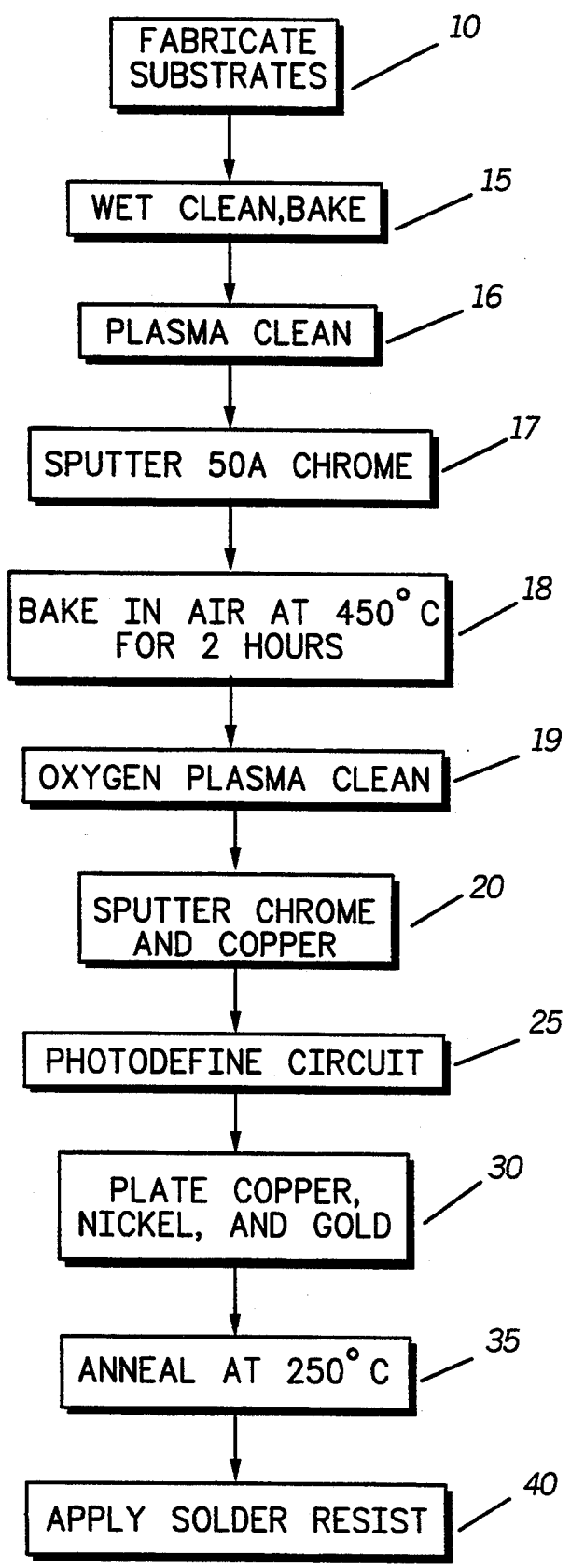
FIG. 1 is a process flow diagram in accordance with the present invention.

Referring now to FIG. 1 of the drawings, the substrates to be metallized are prepared (10) by drilling, punching, blanking, sawing, etc., the substrates prior to metal deposition. The substrates are then cleaned (15) using a solution cleaning process. Any one of several techniques may be used, for example, degreasing with an organic solvent, cleaning in an aqueous cleaning system, cleaning by firing the substrates at elevated temperatures, etc. If solution cleaning techniques are used, the substrates are preferably baked prior to further processing in order to remove any solvents or moisture from the substrates. After this cleaning step, a second cleaning step (16) is invoked utilizing a glow discharge plasma containing oxygen. Plasma gases useful with the present invention are inert (for example, argon or helium), and also contain oxygen or air. The plasma is excited or energized by subjecting the gas at low pressure to either a DC voltage between two electrodes or to a radio frequency field. The oxygen plasma serves to vigorously attack any contaminants on the surface of the ceramic or aluminum nitride substrate and oxidize the hydrocarbon contaminants, converting them to a gaseous state. The plasma cleaning step (16) is optional and may be deleted in appropriate circumstances. The need for plasma cleaning is dictated by the degree of cleanliness of the substrates and the condition of the ambient environment. In many situations, substrates may be suitably metallized without the use of this plasma cleaning step. Those skilled in the art will be readily able to discern the need for plasma cleaning in each situation.

After plasma cleaning (15, 16), the substrates are placed in a sputtering chamber. The sputtering chamber is used to deposit the metal coatings onto the substrate (19). The samples are first sputter etched under vacuum to remove any residual contaminants on the substrate. Sputtering etching is accomplished by reversing the polarity of the sputtering field in order to remove material from the substrate as opposed to depositing on the substrate. After sputter etching and without breaking vacuum, the samples are then coated by sputtering with a thin layer of chromium. This thin layer of chromium is preferably between about 50 Ångstroms and 150 Ångstroms. Other thicknesses of chromium, from about 10 Ångstroms to about 500 Ångstroms may also be used, but the 50–150 Ångstrom range is preferred.

The substrates are then baked (18) in an oxygen-containing environment in order to diffuse the oxygen throughout the chromium layer and completely oxidize the chromium to chromium oxide. To carry out this step, the substrates are typically removed from the sputtering chamber and placed in an oven at temperatures between 250° C. and 600° C., preferably, at 450° C. for two hours. The baking step serves to ensure that the thin layer of chromium is converted to chromium oxide, thereby increasing the bonding between the chromium oxide and the aluminum nitride. This conversion step is necessary because chromium is ideally suited to adhere to oxygen rich surfaces, but oxygen is purposefully removed from the aluminum nitride during the fabrication process. Therefore, the surface of aluminum nitride is typically very deficient in oxygen-bonding sites. It is well known in the art that a minute amount of oxygen will materially degrade the thermal conductivity of the aluminum nitride substrate.

Figure 2:
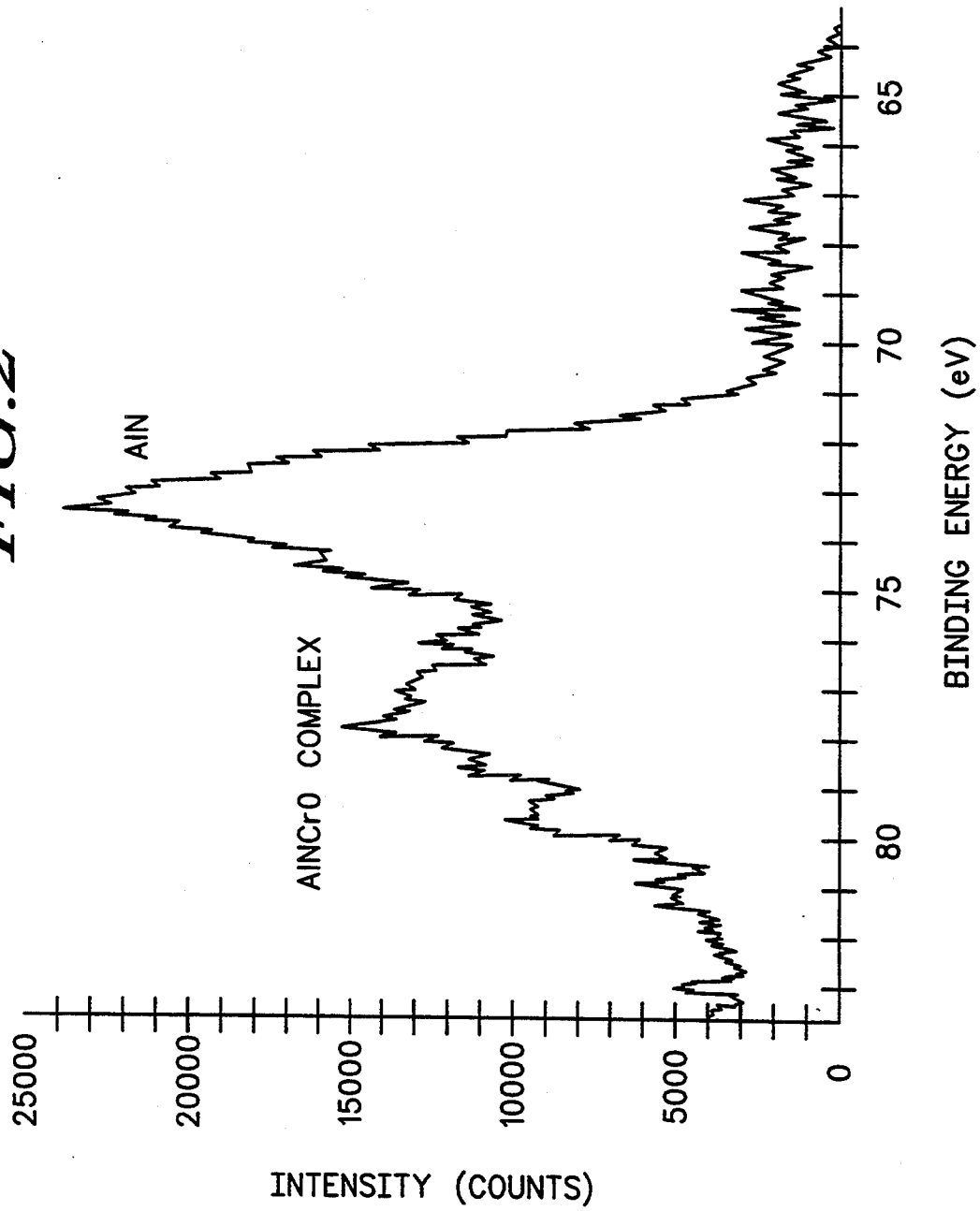
FIGS. 2 and 3 are x-ray photoelectron spectroscopy plots of aluminum nitride treated in accordance with the present invention.
Figure 3:
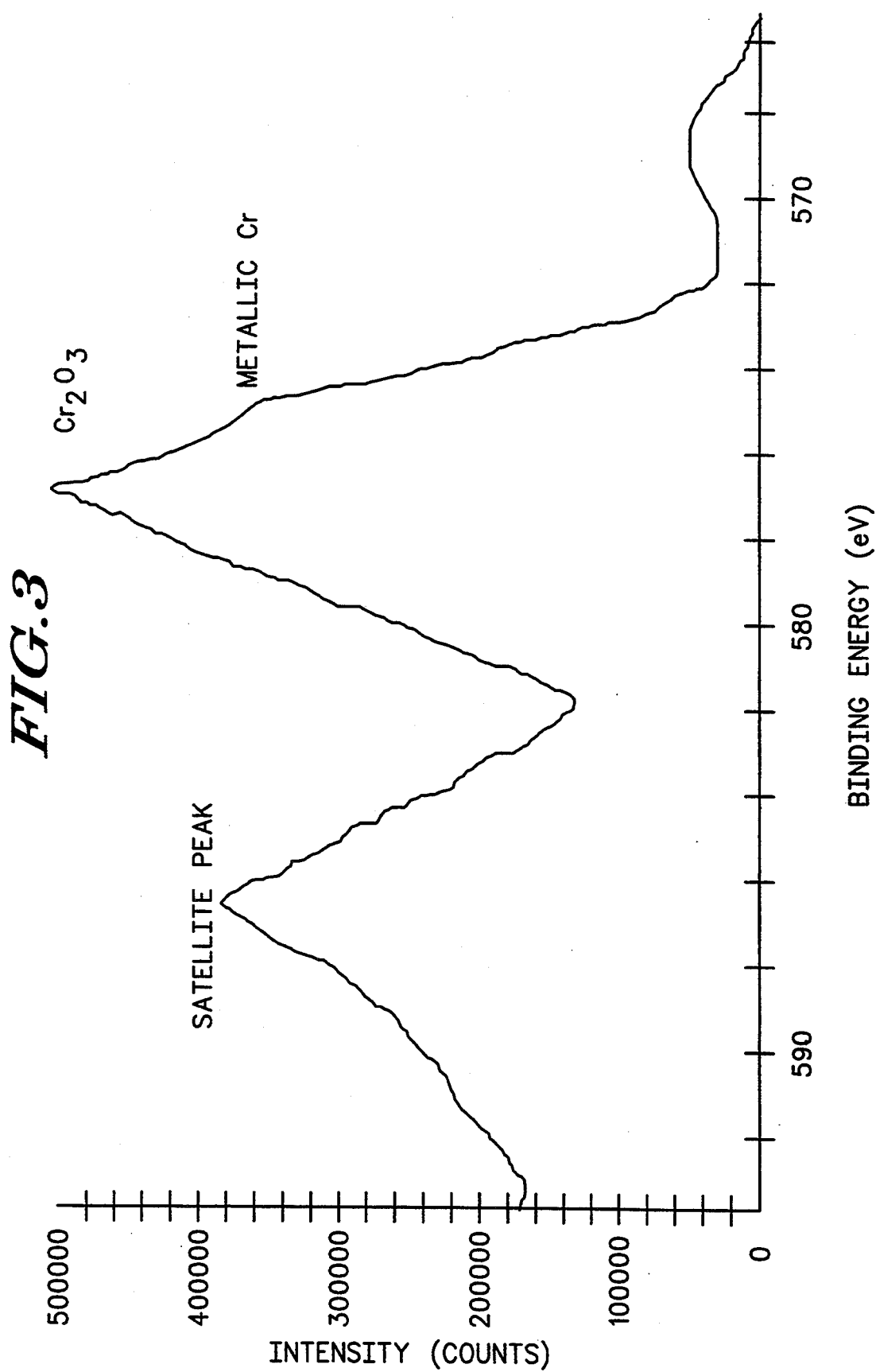

The surface composition of aluminum nitride ceramic treated with a chromium oxide layer was studied with x-ray photoelectron spectroscopy (XPS). The analysis revealed that the surface was composed of aluminum, nitrogen, chromium and oxygen. FIG. 2 shows the presence of an aluminum nitride/chromium oxide complex, in addition to the aluminum nitride substrate. The thickness of the chromium deposit on the treated surface is estimated at 50–75 Ångstroms. The high resolution XPS scan in FIG. 2 demonstrates that the treatment process did not promote or incur oxidation of the aluminum nitride. Had oxidation of the surface occurred, another peak indicating the formation of aluminum oxide, would be seen; however, this peak is absent. Instead, the chromium oxide treatment procedure results in the formation of a complex of the formula $Al_aN_bO_cCr_d$ which is likely responsible for the excellent adhesion between the aluminum nitride and the chromium layer. FIG. 3 shows that the metallic chromium was mostly converted to chromium oxide by the heating treatment, with some metallic chromium remaining.

Referring back to FIG. 1, after the baking step (18) is complete, a second layer of chromium metal is sputtered onto the treated aluminum nitride. Prior to sputtering the second layer, if chromium, the substrates are exposed to a plasma cleaning step (19). This step is required to remove environment contaminants, such as hydrocarbons, from the chromium oxide surface. Plasma gases useful with the present invention are inert (for example, argon or helium), and also contain a percentage of oxygen or air. The plasma is excited or energized by subjecting the gas at low pressure to either a DC voltage between two electrodes or to a radio frequency field. The oxygen plasma serves to vigorously attack any contaminants on the surface of the ceramic or aluminum nitride substrate and oxidize the hydrocarbon contaminants, converting them to a gaseous state.

The plasma cleaning step (16) is optional and may be deleted in appropriate circumstances. The need for plasma cleaning is dictated by the degree of cleanliness of the substrates and the condition of the ambient environment. In many situations, substrates may be suitably metallized without the use of this plasma cleaning step. Those skilled in the art will be readily able to discern the need for plasma cleaning in each situation. Typically, about 600 Ångstroms to about 1000 Ångstroms of chromium is deposited on the chromium oxide layer. Since the chromium oxide layer is tightly bonded now to the aluminum nitride substrate and also has an oxygen rich surface, the chromium that is sputtered during step 20 is tightly bonded to the oxygen rich chromium oxide surface. Another coating of a metal, such as copper, is also applied while the substrates are still under vacuum in order to prevent oxidation of the thicker chromium layer. Typically, between 1000 Ångstroms and 3000 Ångstroms of copper are deposited on the substrate with 1500 to 2500 Ångstroms being the preferred range.

At this point, the substrates are removed from the sputter deposition chamber and may then be subjected to further steps in order to photodefine an electronic circuit pattern, if desired. Photodefinition (25) consists of applying photoresist to the substrate, exposing the photoresist and appropriate artwork to a light source, and developing the photoresist to create a circuit pattern. Metals such as copper, nickel and gold are typically electroplated onto the substrate in order to build up the circuit pattern, and the remaining photoresist is subsequently stripped away. The sputtered layers of copper and chromium are then etched away with acid in order to define the circuitry. The substrate may then be subjected to an optional thermal treatment (35) in order to anneal the various layers of metal together to ensure adhesion between the plated layers and the sputtered layers. If desired, a solder resist may also be applied as shown in step 40. The solder resist may be applied by screen printing an epoxy or by photodefining an acrylic-like photopolymer. The steps of photodefining a circuit, electroplating, annealing, and application of photoresist are well known to those skilled in the art and modifications of these steps are well within the scope of the invention.

Referring now to FIG. 4, a cross-sectional view of an electronic circuit prepared in the manner outlined above, may be seen. The various layers have purposefully not been drawn to scale in order to aid in depicting the structure. The first layer of chromium (42) deposited on the substrate (40) has been converted by the heating process to a layer of chromium metal, chromium oxide, and the aluminum nitride/chromium oxide complex ($Al_aN_bO_cCr_d$), the layer being tightly bonded to the aluminum nitride substrate (40). A second layer of chromium (44) serves as a base for the copper layer (46) which is sputtered and then additionally electroplated. A nickel layer (48) serves to prevent copper migration into the subsequent gold layer (50). A channel (52) has been formed between two adjacent metal structures (54 and 56), allowing an electronic circuit to be formed. A photoresist layer (58) is selectively defined on one of the conductors (54) to electrically insulate it.

In summary, it may be seen that an aluminum nitride substrate having improved adhesion may be easily formed by depositing a layer of chromium and converting the chromium to chromium oxide by thermal treatments. By keeping the chromium oxide layer extremely thin, the oxidized boundary layer does not impact the thermal properties of the aluminum nitride. Measurements of the electrical and thermal properties both before and after the chromium oxide treatment showed no differences. The concept, as espoused herein, may also be applied to other substrates that have an oxygen-deficient surface, such as certain other ceramics, plastics, and metals. In addition, other methods of vacuum depositing metals, such as evaporation, will also find application. Providing an oxygen-bearing species for coupling to an oxygen-deficient substrate may be accomplished by any of several means of metal deposition. Although the above examples are illustrated in order to convey the concept of the present invention, it is not intended that they limit the invention except as by the appended claims herein.

What is claimed is:

1. A metallized substrate, comprising:
   an aluminum nitride substrate;
   a first layer deposited on the substrate, having a thickness of between about 10 Ångstroms and about 500 Ångstroms, and comprising chromium, chromium oxide, and a complex represented by the formula $$Al_aN_bO_cCr_d$$

where a, b, c and d are numbers representing the relative combining ratios, and a and b are each between 0.5 and 1.5., c is between 0.5 and 3.0, and d is between 0.5 and 5; and
   a second layer of metal deposited on the first layer.

2. A metallized substrate, comprising:
   an aluminum nitride substrate;
   a first layer deposited on the substrate, comprising chromium, chromium oxide, and a complex represented by the formula $$Al_aN_bO_cCr_d$$

where a, b, c and d are numbers representing the relative combining ratios and a and b are each between 0.5 and 1.5., c is between 0.5 and 3.0, and d is between 0.5 and 5; and
   a layer of copper deposited on the first layer.

3. The metallized substrate as described in claim 1, wherein the second layer of metal comprises at least one metal selected from the group consisting of aluminum, cobalt, copper, iron, nickel, palladium, platinum, rhenium, rhodium, silicon, tantalum, titanium, tungsten, vanadium, and alloys thereof.

* * * * *